United States Patent
Adigun (10) Patent No.: US 12,235,309 B2
(45) Date of Patent: Feb. 25, 2025

(54) DEVICE, SYSTEM AND METHOD FOR FAULT DETECTION

(71) Applicant: Eskom Holdings SOC Limited, Sandton (ZA)

(72) Inventor: Peter Ayotola Adigun, Pinetown (ZA)

(73) Assignee: ESKOM HOLDINGS SOC LIMITED, Sandton (ZA)

( * ) Notice: Subject to any disclaimer, the term of this patent is extended or adjusted under 35 U.S.C. 154(b) by 123 days.

(21) Appl. No.: 18/256,735

(22) PCT Filed: Dec. 8, 2021

(86) PCT No.: PCT/IB2021/061456
§ 371 (c)(1),
(2) Date: Jun. 9, 2023

(87) PCT Pub. No.: WO2022/123457
PCT Pub. Date: Jun. 16, 2022

(65) Prior Publication Data
US 2024/0027510 A1    Jan. 25, 2024

(30) Foreign Application Priority Data
Dec. 11, 2020   (ZA) ................................. 2020/07741

(51) Int. Cl.
*G01R 33/02*      (2006.01)
*G01R 15/14*      (2006.01)
*G01R 31/08*      (2020.01)

(52) U.S. Cl.
CPC ......... *G01R 31/085* (2013.01); *G01R 15/148* (2013.01); *G01R 31/088* (2013.01)

(58) Field of Classification Search
CPC .. G01R 15/148; G01R 31/085; G01R 31/088; G01R 33/02
See application file for complete search history.

(56) References Cited

U.S. PATENT DOCUMENTS

2015/0380923 A1* 12/2015 Ukil ................. H02H 3/083
                                                    361/93.1
2017/0052222 A1*  2/2017 Pasdar ................ G01R 31/11
(Continued)

FOREIGN PATENT DOCUMENTS

CN     102645613 A     8/2012
CN     102073027 B     1/2014
(Continued)

OTHER PUBLICATIONS

International Search Report for International Patent Application PCT/IB/2021/061456 (ISA/EP) mailed Apr. 11, 2022 (4 pages).
(Continued)

*Primary Examiner* — Thang X Le
(74) *Attorney, Agent, or Firm* — ALSTON & BIRD LLP (57) ABSTRACT

The invention relates to a fault current detection device for an overhead power line. The fault current detection device is configured to apply a fault detection algorithm which includes a duration test and a return to normal test. The fault current detection device reports a fault current to a remote fault monitoring device only if both tests are passed. The fault monitoring device is configured to apply an alert ranking algorithm to determine which of a plurality of the fault current detection devices is closest to a fault. The alert ranking algorithm includes identifying or establishing a location of an upstream source associated with the fault current detection devices and classifying the fault current detection device which is the furthest downstream from the upstream source as the closest to the fault. A fault current detection method and a fault detection system and method are disclosed.

19 Claims, 10 Drawing Sheets

(56) References Cited

U.S. PATENT DOCUMENTS

2021/0231723 A1* 7/2021 Hao ................. G01R 19/2513
2022/0137117 A1* 5/2022 Burström ............... G01P 15/00
                                                                                                        324/512

FOREIGN PATENT DOCUMENTS

| EP | 1129359 A1 | 9/2001 |
| JP | H04-242175 A | 8/1992 |
| JP | H06-88851 A | 3/1994 |
| JP | H06-94776 A | 4/1994 |
| JP | H07-333287 A | 12/1995 |
| JP | H08-196033 A | 7/1996 |
| NO | 300030 B1 | 3/1997 |

OTHER PUBLICATIONS

Written Opinion for International Patent Application PCT/IB2021/061456 (ISA/EP) mailed Apr. 11, 2022 (8 pages).
International Preliminary Report on Patentability for International Patent Application PCT/IB2021/061456 completed Dec. 2, 2022 (18 pages).

* cited by examiner

| Time | UDI | Feeder | SB | Priority | Location | Battery | Status |
|---|---|---|---|---|---|---|---|
| 18:15:16 | 32010 | Manguzi NB73 | 50 | 4 | S2500 | 3.81V | Fault |
| 18:15:17 | 32004 | Manguzi NB73 | 271 | 2 | T833L1 | 4.00V | Fault |
| 18:15:19 | 32012 | Manguzi NB73 | 271 | 1 | T779L1 | 4.07V | Fault |
| 18:15:19 | 32003 | Manguzi NB73 | 50 | 3 | S3309 | 4.07V | Fault |
| 18:20:50 | 32004 | Manguzi NB73 | 271 | 2 | T833L1 | 4.00V | Fault |
| 18:20:57 | 32010 | Manguzi NB73 | 50 | 4 | S2500 | 3.80V | Fault |
| 18:20:59 | 32003 | Manguzi NB73 | 50 | 3 | S3309 | 4.06V | Fault |
| 18:20:59 | 32012 | Manguzi NB73 | 271 | 1 | T779L1 | 4.07V | Fault |
| 18:53:35 | 32004 | Manguzi NB73 | 271 | 2 | T833L1 | 4.00V | Fault |
| 18:53:35 | 32010 | Manguzi NB73 | 50 | 4 | S2500 | 3.80V | Fault |
| 18:53:42 | 32003 | Manguzi NB73 | 50 | 3 | S3309 | 4.05V | Fault |
| 18:53:42 | 32012 | Manguzi NB73 | 271 | 1 | T779L1 | 4.06V | Fault |
| 19:06:50 | 32010 | Manguzi NB73 | 50 | 4 | S2500 | 3.80V | Fault |
| 19:06:50 | 32004 | Manguzi NB73 | 271 | 2 | T833L1 | 3.99V | Fault |
| 19:06:52 | 32012 | Manguzi NB73 | 271 | 1 | T779L1 | 4.07V | Fault |
| 19:06:52 | 32003 | Manguzi NB73 | 50 | 4 | S3309 | 4.04V | Fault |
| 19:19:19 | 32012 | Manguzi NB73 | 271 | 1 | T779L1 | 4.05V | Fault |
| 19:19:24 | 32004 | Manguzi NB73 | 271 | 2 | T833L1 | 3.99V | Fault |
| 19:19:22 | 32010 | Manguzi NB73 | 50 | 4 | S2500 | 3.80V | Fault |
| 19:19:25 | 32003 | Manguzi NB73 | 50 | 3 | S3309 | 4.04V | Fault |

FIGURE 15

DEVICE, SYSTEM AND METHOD FOR FAULT DETECTION

CROSS-REFERENCE TO RELATED APPLICATIONS

This application is a national phase entry of International Application No. PCT/IB2021/061456, filed Dec. 8, 2021, which claims priority to South African Application No. 2020/07741, filed Dec. 11, 2020, the contents of which are hereby incorporated by reference in their entirety.

FIELD OF THE INVENTION

The invention relates to a device, system and method for fault detection, particularly (but not exclusively) for fault current detection in medium-voltage (MV) networks.

BACKGROUND TO THE INVENTION

In electric power distribution, MV networks often extend for hundreds of kilometres. Fault finding on these networks can therefore be a long and difficult process which leaves customers without electricity for hours or even days. This has an adverse effect on the daily lives of citizens and the functioning of the economy.

Fault sensing or detection devices, also referred to as fault indicators, may reduce the fault finding time on these networks for field service staff by ensuring that they start their fault finding process closer to the location of the fault. Various types of fault current indicators exist for use on overhead lines, including conductor-mounted and pole-mounted devices. However, there are a number of drawbacks associated with the current fault current indicators of which the Applicant is aware.

The Applicant has found that due to the relatively high cost of existing fault indicators, it is usually not possible to install them at all desired locations in a network. Instead, they may typically be installed at strategic locations based on factors such as fault history or geographical terrain.

Fault indicators may also be susceptible to false triggers. For instance, lightning surges or load changes may cause such a device to report a fault current incorrectly, thus leading to unnecessary time, effort and cost in investigating the false alarm.

Furthermore, when fault indicators are installed across a voltage network, a fault current may lead to a number of fault indicators being triggered and reporting or indicating the fault. While this provides a useful starting point for field service staff, it may still be difficult and time-consuming to locate the fault indicator closest to the fault and thus identify the source of the problem.

The present invention aims to address or alleviate the issues described above, at least to some extent, thereby to assist in efficiently diagnosing, locating and/or fixing power line issues.

SUMMARY OF THE INVENTION

In accordance with a first aspect of the invention, there is provided a fault current detection device comprising:
 a housing configured to be mounted to a support structure of an overhead power line;
 a magnetic field sensor located in or on the housing and configured to be positioned in proximity to, but not in direct contact with, an electrical conductor of the overhead power line, the magnetic field sensor being configured to obtain magnetic field measurements;
 a processing component located in or on the housing and configured to analyse the measurements obtained by the magnetic field sensor and to apply a fault detection algorithm upon detecting a change in a magnetic field value which exceeds a predefined threshold, the fault detection algorithm including a duration test which is passed if the change occurred for more than a predefined period of time and a return to normal test which is passed if the magnetic field value substantially returns to a normal or prior level following the change, the processing component being configured to classify the change as a fault current only if the change passes both the duration test and the return to normal test;
 a communication module located in or on the housing and configured to transmit a fault alert to a remote fault monitoring device in response to the processing component classifying the change as a fault current; and
 a power source for powering the magnetic field sensor, the processing component and the communication module.

The magnetic field measurements may be measurements of magnetic flux density or magnetic field strength. Accordingly, the magnetic field value may be the magnetic flux density or magnetic field strength measured by the magnetic field sensor and the change may be a predefined change therein.

In embodiments of the invention, the change is only classified as a fault if it exceeds an initial threshold. Preferably, the threshold is a user selectable threshold. In such cases, once the threshold is exceeded, the fault current detection device samples data (measurements) from the magnetic field sensor, which data is then subjected to the duration test and the return to normal test. The data may be sampled for between around 100 milliseconds and 300 milliseconds, e.g. approximately 200 milliseconds.

The housing may include a mounting formation permitting the fault current detection device to be mounted to the support structure. The support structure may be a pole and the fault current detection device may be strapped to a pole such that it is located closer than about 5 m to the conductor, preferably about 2.5 m below the conductor in use. The fault current detection device may be portable.

The magnetic field sensor may be a magnetometer or digital compass sensor, preferably a tri-axial magnetometer.

The communication module may include a GSM (Global System for Mobile Communication) or GPRS (General Packet Radio Service) module, or another suitable communication module.

The fault monitoring device may be a master station connected or connectible to the fault current detection device.

The processing component may be configured to receive remote settings instructions from the remote fault monitoring device, e.g. from the remote master station. Parameters employed by the processing component, such as the threshold, electrical network name, operating location/device location, device's priority number and a frequency at or with which the device must "check-in" with the fault monitoring device to maintain its status as active with the fault monitoring device, may be modified based on the settings instructions.

The power source may be rechargeable. The power source may be a solar power arrangement including a solar panel mounted to an exterior of the housing and one or more rechargeable batteries connected to the solar panel for providing power to the magnetic field sensor, the processing component and the communication module.

In accordance with a second aspect of the invention, there is provided a fault current detection method comprising:
    using a sensor positioned in proximity to, but not in direct contact with, an electrical conductor of an overhead power line to obtain magnetic field measurements;
    analysing, by a processing component, the measurements obtained by the sensor;
    upon detecting a change in a magnetic field value which exceeds a predefined threshold, using the processing component to apply a fault detection algorithm including a duration test which is passed if the change occurred for more than a predefined period of time and a return to normal test which is passed if the magnetic field value substantially returns to a normal or prior level following the change;
    classifying the change as a fault current if the change passes both the duration test and the return to normal test; and
    transmitting a fault alert to a remote fault monitoring device in response to the classification of the change as a fault current.

In accordance with a third aspect of the invention, there is provided a fault detection system comprising:
    a plurality of fault current detection devices installed across a network of overhead power lines; and
    a fault monitoring device communicatively coupled to the fault current detection devices and including
        a receiving module for receiving fault alerts from the fault current detection devices indicative of fault currents in the network;
        a processor configured to apply an alert ranking algorithm to determine which fault current detection device is closest to a fault in the event that a subset of the fault current detection devices each transmits a fault alert to the fault monitoring device, wherein the alert ranking algorithm includes identifying or establishing locations of each of the subset of fault current detection devices, identifying or establishing a location of an upstream source associated with the subset of fault current detection devices, and classifying the fault current detection device in the subset which is furthest downstream from the upstream source as closest to the fault; and
        a transmitting module for transmitting a fault location alert indicative of the location of the closest fault current detection device and/or of the fault.

The fault monitoring device may be a master station connected or connectible to all of the fault current detection devices.

The network may be a medium-voltage (MV) network.

The processor of the fault monitoring device may be configured to rank the subset of fault current detection devices based on their respective distances from the upstream source, wherein the fault current detection device with the highest or lowest ranking (depending on the implementation of the algorithm) belongs to the fault current detection device closest to the fault.

Preferably, each of the fault current detection devices is a detection device as defined above (e.g. with reference to the first and second aspects of the invention).

The transmitting module may be configured to transmit the fault location alert to one or more user devices.

In accordance with a fourth aspect of the invention, there is provided a fault detection method comprising:
    receiving a fault alert from each of a plurality of fault current detection devices installed across a network of overhead power lines;
    applying, by a processor, an alert ranking algorithm to determine which fault current detection device is closest to a fault, the alert ranking algorithm including
        identifying or establishing locations of each of the fault current detection devices,
        identifying or establishing a location of an upstream source associated with the fault current detection devices, and
        classifying the fault current detection device which is furthest downstream from the upstream source as closest to the fault; and
    transmitting a fault location alert indicative of the location of the closest fault current detection device and/or of the fault.

Preferably, each of the fault current detection devices is a detection device as defined above (e.g. with reference to the first and second aspects of the invention).

The method may include ranking the fault current detection devices based on their respective distances from the upstream source, wherein the fault current detection device with the highest or lowest ranking (depending on the implementation of the algorithm) belongs to the fault current detection device closest to the fault.

BRIEF DESCRIPTION OF THE DRAWINGS

The invention will now be further described, by way of example, with reference to the accompanying drawings.

In the drawings.

DETAILED DESCRIPTION WITH REFERENCE TO THE DRAWINGS

The following description of the invention is provided as an enabling teaching of the invention, is illustrative of the principles of the invention and is not intended to limit the scope of the invention. It will be understood that changes can be made to the embodiment/s described and depicted, while still attaining beneficial results of the present invention. Furthermore, it will be understood that some benefits of the present invention can be attained by selecting some of the features of the present invention without utilising other features. Accordingly, those skilled in the art will recognise that modifications and adaptations to the present invention are possible and can even be desirable in certain circumstances, and are a part of the present invention.

Figure 1:
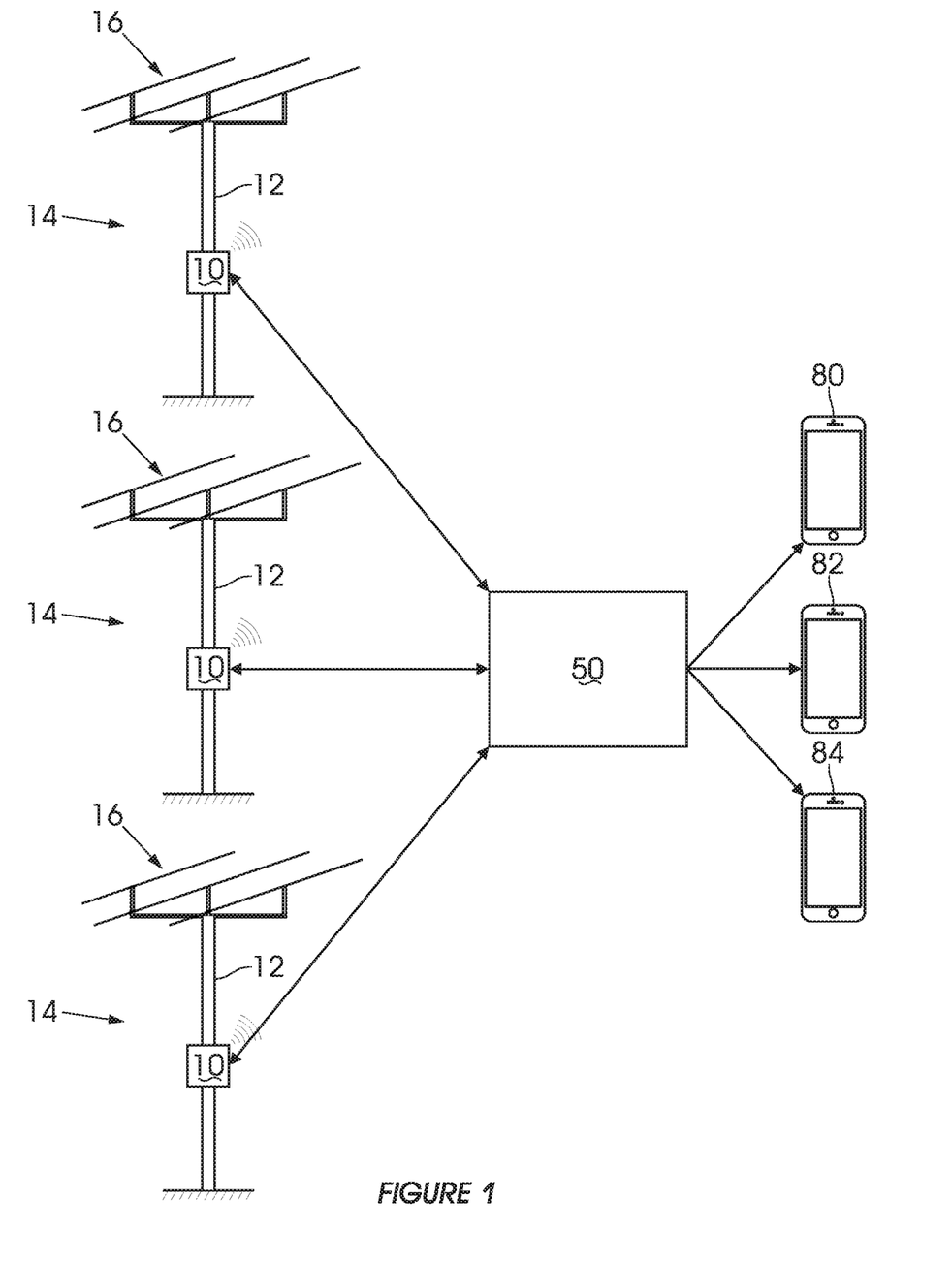
FIG. 1 is a schematic illustration of an embodiment of a fault detection system according to the invention.

Referring to FIG. 1, a fault current detection device 10 (hereafter the "detection device 10") is installed at various points across a medium-voltage (MV) electricity distribution network to detect and report fault currents to a remote fault monitoring device in the form of a master station 50. The master station 50 in turn analyses fault alerts it receives from the detection devices 10 and alerts user devices 80, 82, 84 of fault locations or zones in the network. In this example embodiment, the devices 10, 50, 80, 82, 84 communicate over a suitable cellular network. However, it will be appreciated that they may communicate using other network or protocols, e.g. over the Internet.

Figure 7:
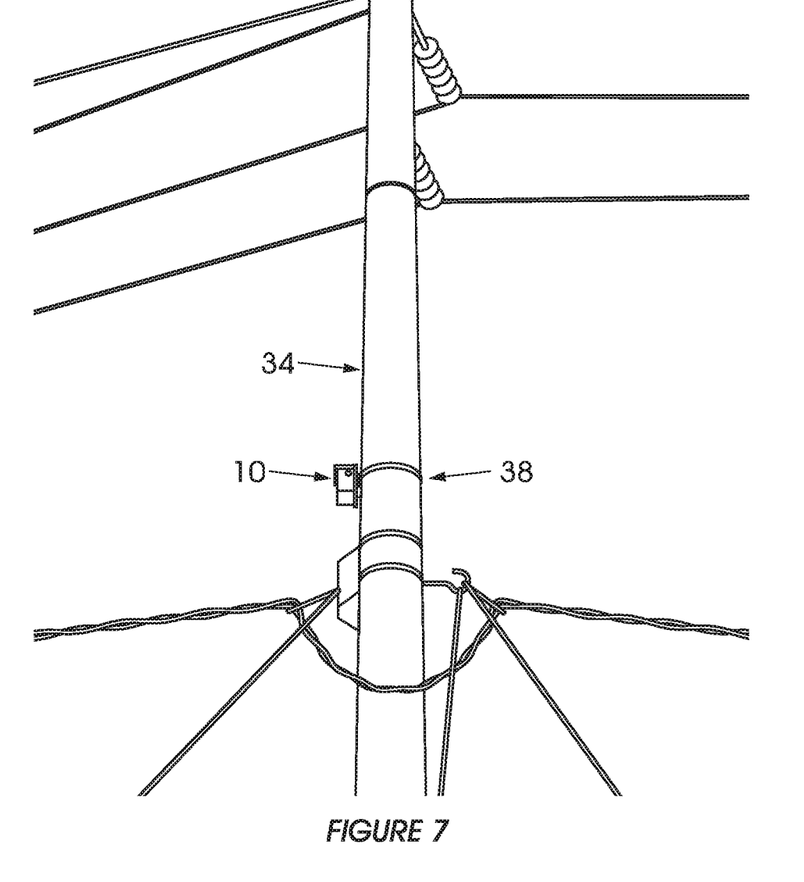
FIGS. 7 and 8 illustrate three-dimensional views of the fault current detection device of FIGS. 3 to 6 mounted to a power line pole.
Figure 8:
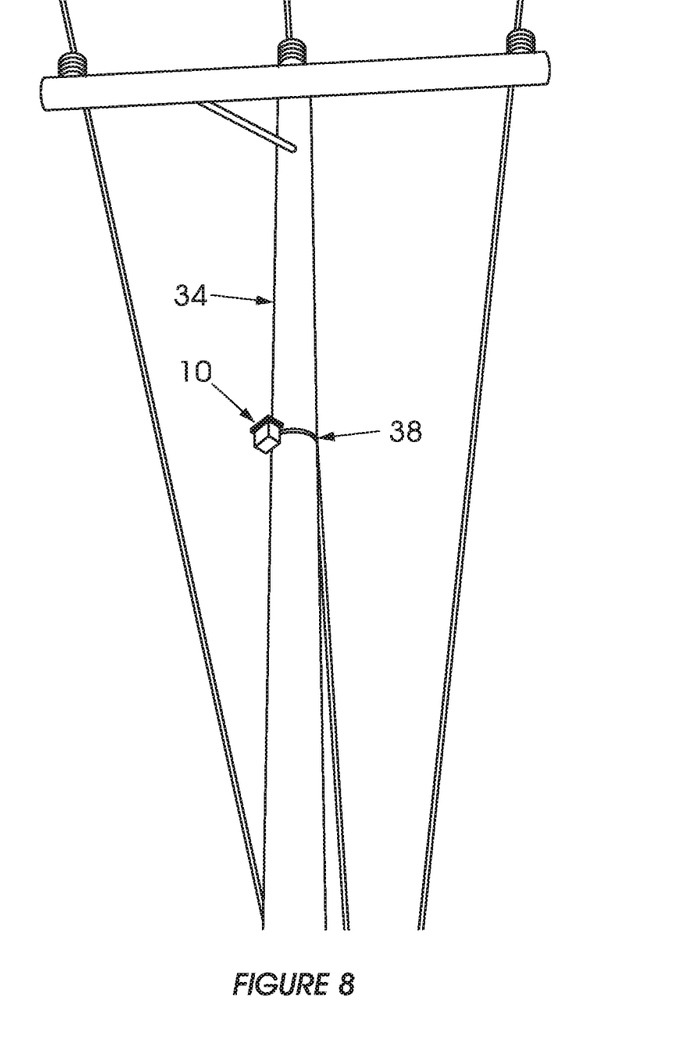

The detection device 10 is pole-mounted, i.e. it is mounted to a support structure in the form of a pole 12 of an overhead power line 14. The detection device 10 is preferably located about 2.5 m below the electrical conductors 16 of the line 14 (refer also to the examples in FIGS. 7 and 8).

Figure 2:
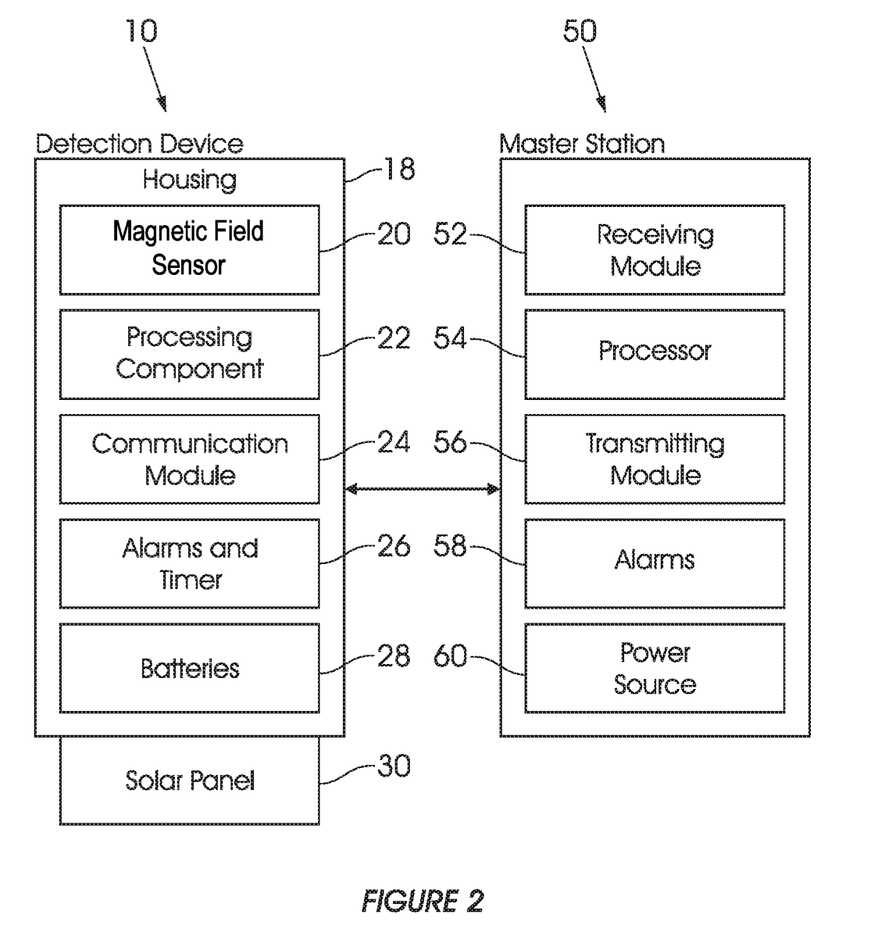
FIG. 2 is a block diagram illustrating logical/functional components of an embodiment of a fault current detection device ("Detection Device") and an embodiment of a fault monitoring device ("Master Station"), forming part of the system of FIG. 1.
Figure 3:
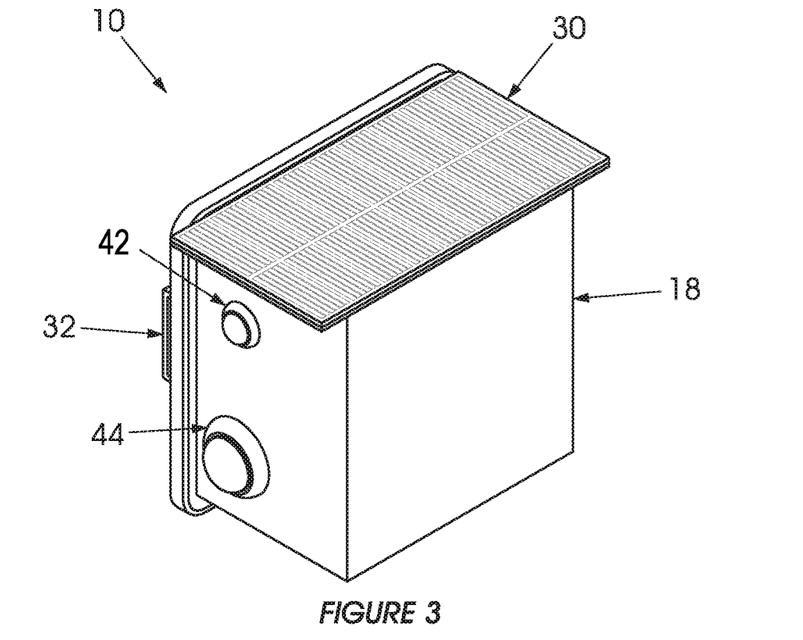
FIG. 3 is a perspective view of an example embodiment of a fault current detection device according to the invention.
Figure 4:
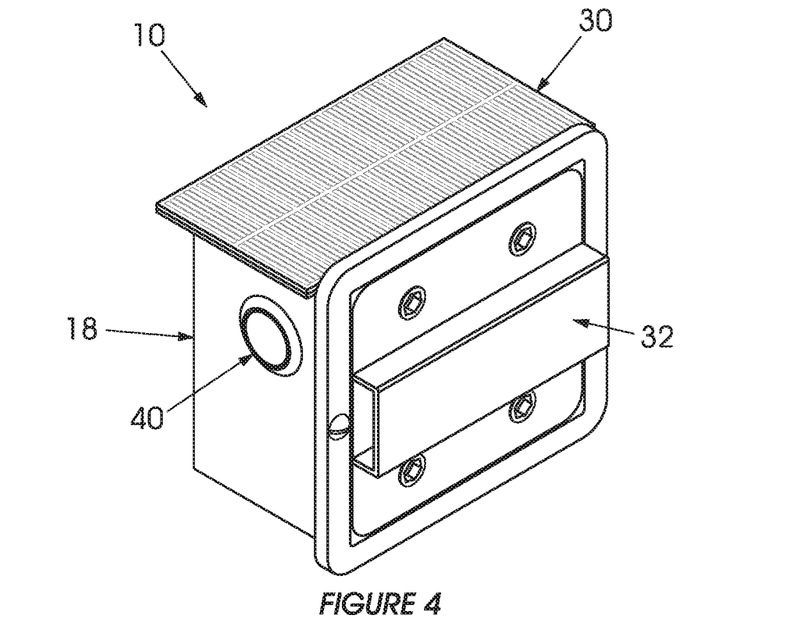
FIG. 4 is another perspective view of the device of FIG. 3.

Components of the detection device 10 and the master station 50 are shown logically in FIG. 2. The detection device 10 has a housing 18 which houses a 8 cm×6 cm circuit board including a magnetic field sensor 20 and providing functionality of a processing component 22 and a communication module 24. A rechargeable battery pack 28 is also contained in the housing 18 and coupled to the circuit board. The detection device 10 further includes a solar panel 30 which charges the batteries 28 in use.

In this example embodiment, the magnetic field sensor 20 is a "Honeywell HMC5883L digital compass" sensor, which is a tri-axial magnetometer configured to measure both magnetic field direction and magnitude. In use, the magnetic field sensor 20 thus obtains and reports magnetic field measurements, in this case being measurements of magnetic flux density (measured in Gauss/Tesla).

The processing component 22 is configured to analyse the measurements obtained by the magnetic field sensor 20 and to apply a fault detection algorithm thereto, which will be described in more detail below with reference to FIGS. 9 to 11.

In this embodiment, the communication module 24 is a GSM module configured to send data to and receive data from the master station 50. In particular, the communication module 24 transmits a fault alert to the master station 50 in the event that a fault current is detected and classified as a fault by the detection device 10. The communication module 24 may also be configured to receive instructions from the master station 50, e.g. settings instructions such as instructions to change a fault threshold on the device 10 or instructions on parameters to apply to the fault detection algorithm employed by the device 10.

The device 10 is also configured to implement battery and sensor alarms and includes a self-resetting watchdog timer (see numeral 26 in FIG. 2).

As mentioned above, in this example embodiment, the power source is in the form of a solar panel arrangement. The solar panel 30 is fitted on the outside of the housing 18 and is used to charge the battery pack 28, in turn ensuring that the abovementioned components of the detection device 10 are powered.

The housing 18 of an example version of the device 10 is shown in FIGS. 3 to 6 and includes a mounting formation in the form of a bracket 32 allowing the housing 18 to be mounted to a pole. Referring to the examples in FIGS. 7 and 8, the device 10 can be mounted to poles 34, 36 using straps/bands 38 threaded through the bracket 32 and secured against the poles 34, 36. For instance, BAND-IT™ stainless steel bands or similar straps/bands may be employed for this purpose.

Figure 5:
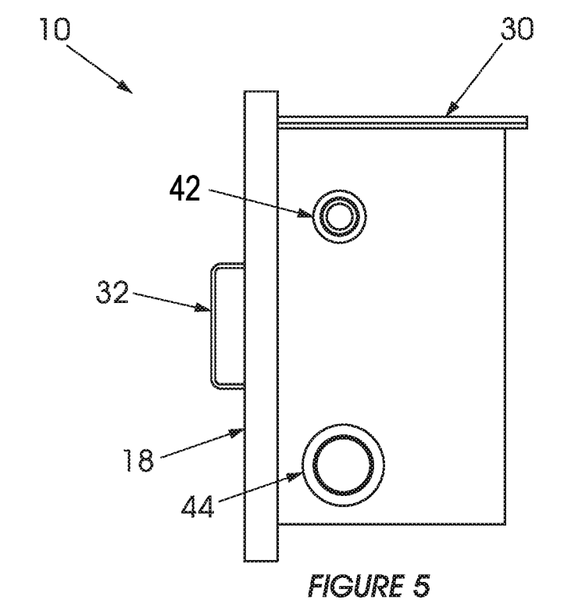
FIG. 5 is a side view of the device of FIG. 3.
Figure 6:
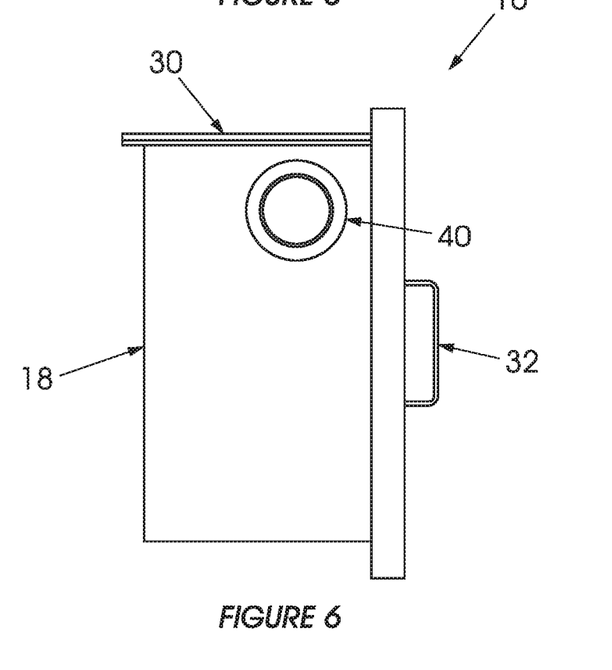
FIG. 6 is an opposite side view of the device of FIG. 3.

Referring to FIGS. 5 and 6, in addition to the panel 30, the exterior of the detection device 10 may include an off/on switch 40 and a light 42 which may be used to indicate whether the detection device 10 is activated and/or that a fault has been detected. The device 10 also includes a push button 44. The button 44 may be used to force the device 10 into a configuration mode where it receives new settings. The button 44 is depressed while switching on the device 10 to force it to boot up in configuration mode. Once settings are received from the master station 50 the device 10 auto-restarts and "checks-in" with the master station 50 with the newly received settings. Settings include, but are not limited to, the following: electrical network name, operating location (where the device 10 will be installed), alarm threshold, device's priority number and "check-in" frequency.

As mentioned above, the master station 50 can communicate with a number of detection devices 10 across a network. Typically, the master station 50 may communicate with hundreds or thousands of these detection devices 10 (sometimes across different/disparate distribution networks), in use.

As shown in FIG. 2, the master station 50 includes a receiving module 52 for receiving fault alerts from the detection devices 10 indicative of fault currents detected on an overhead line. The master station 50 also includes a processor 54 configured to apply an alert ranking algorithm, which is described in greater detail below with reference to FIGS. 12 to 15. The master station 50 also includes a transmitting module 56 for sending fault location alerts to the user devices 80, 82, 84. The user devices 80, 82, 84 may for instance be devices of field staff, supervisors, managers, or the like, so as to notify these individuals of faults.

The fault location alert may be indicative of a fault location or a location of the closest detection device 10 to a fault, established by the master station 50 using the alert ranking algorithm. In some cases the fault location alert may simply include the name or another identifier of the device 10 or another network component closest to the fault. The master station may also include suitable alarms 58, e.g. a conventional battery alarm and/or error alarm, and a suitable power source 60 such as a rechargeable battery or mains power connection.

In use, fault currents may create large changes in magnetic fields which can be detected by the sensors 20 of the detection devices 10. The presence or passage of fault current on an MV network is thus detected by placing the sensors 20 in proximity of the relevant line/s. However, magnetometers are also sensitive to surges (e.g. as a result of lightning) and shifts in load (e.g. those that occur at the start and end of peak electricity usage periods). Accordingly, the detection device 10 has been specifically configured to detect and filter out surges and shifts not caused by faults to ensure that faults are not incorrectly/unnecessarily reported.

In order to detect and filter out these "false positives", the device 10 employees a fault detection algorithm. Upon detecting a change in the magnetic field value the sensor 20 measures, a duration test and a return to normal test are applied to the measured sensor data. The change must exceed a predefined threshold so as to filter out changes that are too small/minor and thus threshold may be user selectable. The duration test is passed if the change occurred for more than a predefined period of time and the return to normal test is passed if the value substantially returns to a normal or prior level following the change. In this example embodiment, the return to normal test works as follows: the magnetic field must return to normal after 100 ms, but within a 200 ms sample period following the crossing of the user-selectable alarm threshold.

The detection device 10 is configured and programmed such that both the duration test and the return to normal test must be passed before classifying the change as a fault and reporting it to the master station 50.

Figure 9:
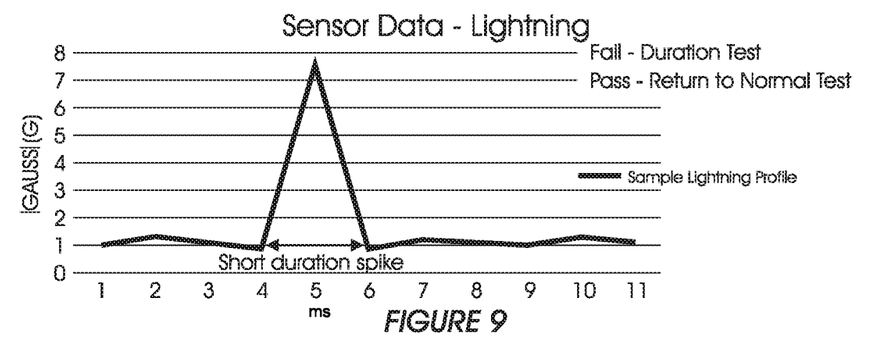
FIG. 9 is a graph showing a magnetic field change due to lightning in order to illustrate the application of a fault detection algorithm.

As a first example, FIG. 9 illustrates the manner in which the duration test may prevent a lightning surge from being reported to the master station 50. As a result of lightning, there may be a very brief spike in magnetic flux density, e.g. from about 1 Gauss (0.0001 Tesla) to between 7 and 8 Gauss (0.0007-0.0008 Tesla) as shown in FIG. 9. However, because the change occurred only for a short period it does not pass the duration test and is not classified as a fault current (even though it passes the return to normal test).

Figure 10:
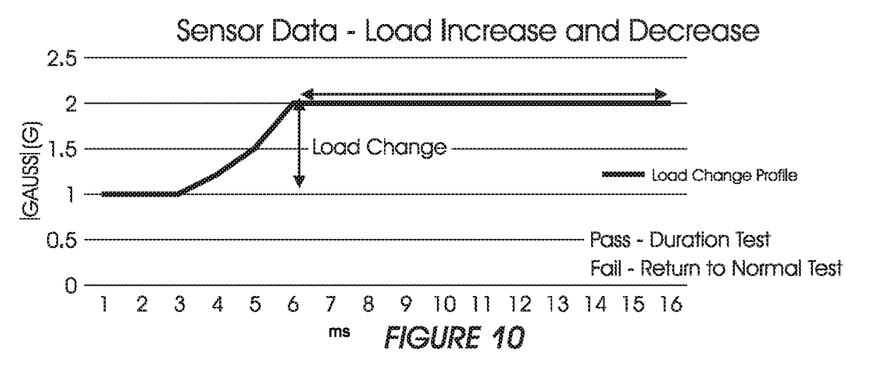
FIG. 10 is a graph showing a magnetic field change due to a load change in order further to illustrate the application of the fault detection algorithm.

As a second example, FIG. 10 illustrates the manner in which the return to normal test prevents a load increase/decrease from being reported to the master station 50. As a result of increased load due to the start of a peak usage period, there may be an increase in magnetic flux density, e.g. from about 1 Gauss (0.0001 Tesla) to about 2 Gauss (0.0002 Tesla) as shown in FIG. 10. However, because the value did not return to normal after the change (it stays high for the duration of the peak period), the change does not pass the return to normal test and is not classified as a fault current (even though it passes the duration test). In this example embodiment, the magnetic field has to return to normal after the halfway point (100 ms) of the 200 ms period in which the device 10 collects/samples extra data used to determine the legitimacy of the fault.

Figure 11:
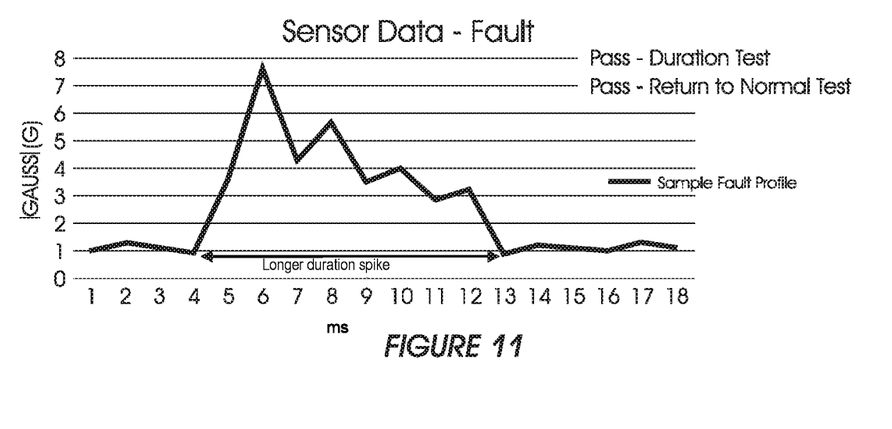
FIG. 11 is a graph showing a magnetic field change due to a fault current in order further to illustrate the application of the fault detection algorithm.

As a third example, FIG. 11 illustrates a fault profile which would lead to a fault actually being reported to the master station 50. In the case of FIG. 11, as a result of the presence/passage of fault current, the magnetic field measurement taken by the sensor 20 changed for longer than a predefined time period (thus passing the duration test) and returned to normal thereafter (thus passing the return to normal test). In response to detecting the profile shown in FIG. 11, the detection device 10 would thus classify the change as a fault current and transmit a fault alert to the master station 50.

It will be appreciated that, when the detection devices 10 are installed across a network, a fault current may lead to a number of the devices 10 being triggered and reporting or indicating the fault to the master station 50, essentially defining a "fault current path". The master station 50 is specifically configured to use the detection devices as "fault path indicators" (hence the abbreviation "FPI" in FIGS. 12 to 14) and to identify the detection device closest to the fault.

The master station 50 of this example embodiment is configured to automate this process through the alert ranking algorithm which ranks the detection devices 10 based on their location on the network. In this embodiment, the master station 50 will identify the detection device with the highest ranking as belonging to the one closest to the fault.

In the event that a number of the detection devices each transmits a fault alert to the master station 50, the alert ranking algorithm is initiated and includes the following steps:

identifying the locations of each of the detection devices that have reported the fault;

identifying a location of an upstream source associated with those detection devices (typically the closest upstream generating station or substation); and classifying the detection device which is the furthest downstream from the upstream source as the closest to the fault.

Figure 12:
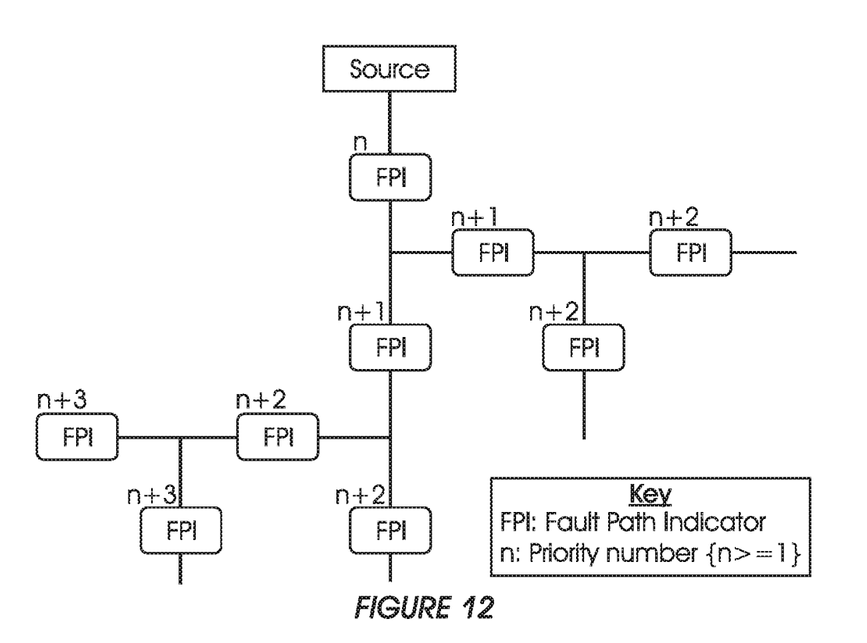
FIG. 12 is a schematic illustration of a network of fault current detection devices coupled to an upstream source ("Source")
Figure 13:
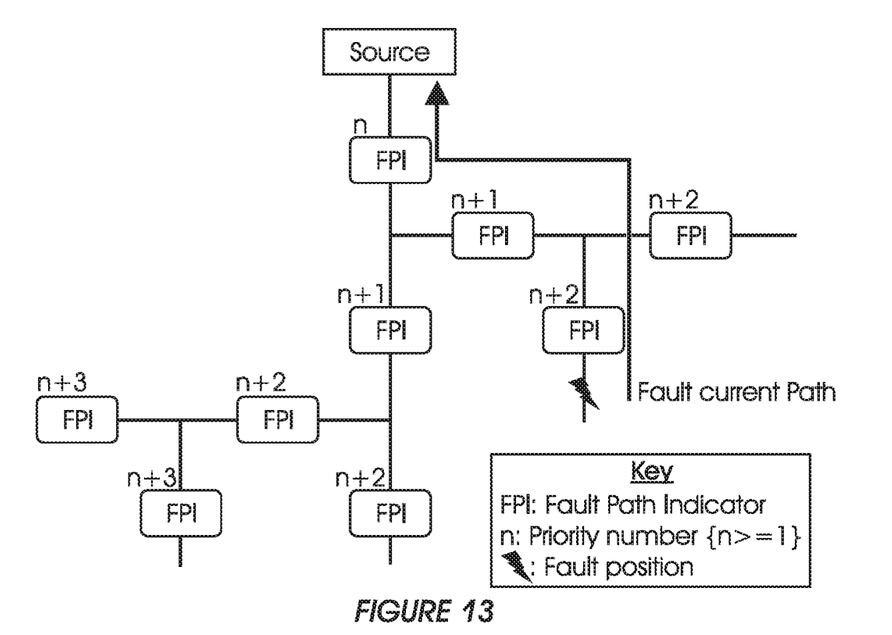
FIG. 13 is another schematic illustration of the network of FIG. 12, illustrating the application of an alert ranking algorithm.

Referring to FIGS. 12 and 13, the processor 54 ranks the detection devices (FPIs) according to their respective distances from the upstream source. For instance, and as shown in FIGS. 12 and 13, the closest detection device may be given the priority number "n", and as the processor 54 proceeds downstream, one may be added such that the farthest detection device/s has/have the highest priority/ranking.

Figure 14:
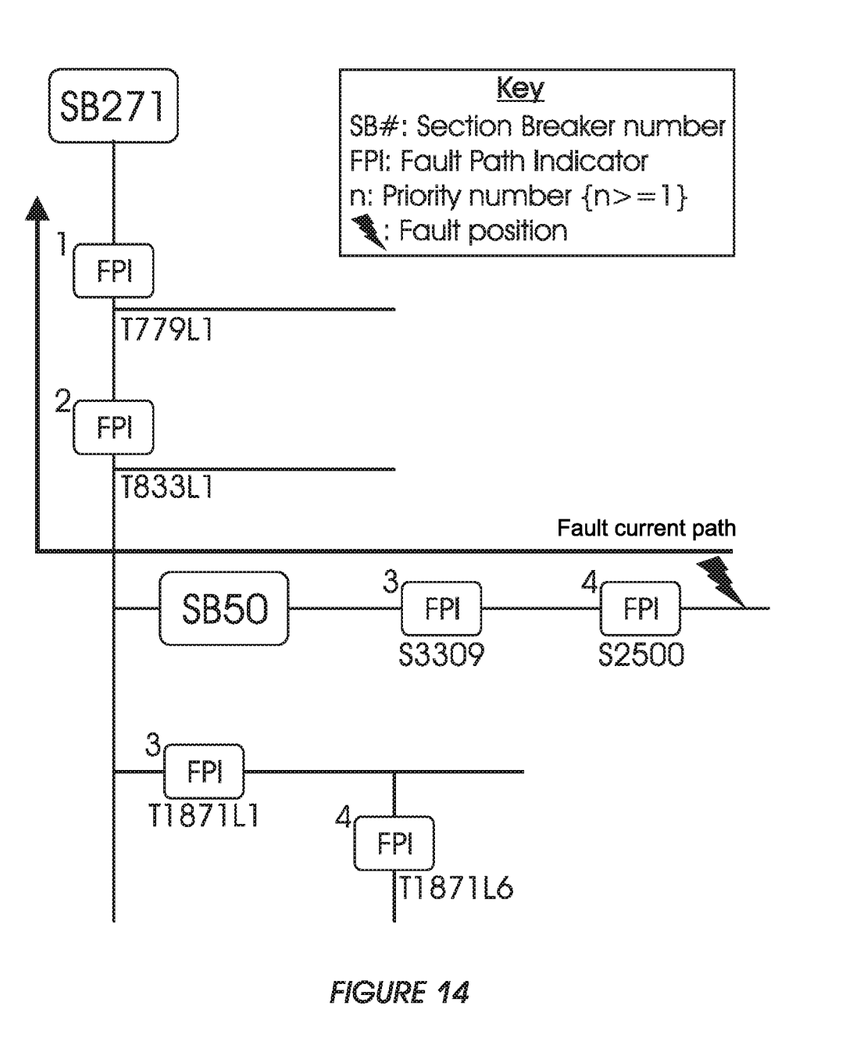
FIG. 14 is a schematic illustration of another network of fault current detection devices, together with two section breakers.

Turning to the example of FIG. 14, the following detection devices (FPIs) at the following locations reported fault alerts to the master station 50:

T779L1
T833L1
S3309
S2500

The master station 50 then needs to determine which one is closest to the fault, i.e. which alarm message corresponds to the most "relevant" device, in order to assist technicians/staff in finding the fault or finding the fault more rapidly/efficiently. In order to do this, the master station 50 implements the ranking algorithm. Accordingly, the FPI at location T779L1 is ranked "1" as it is closest to the upstream source, with the FPIs at T833L1, S3309 and S2500 ranked "2", "3" and "4" respectively as the algorithm proceeds downstream. Thus, the FPI at location S2500 is classified as being closest to the fault (due to having the highest ranking/priority), with the fault current path being as shown in FIG. 14. For instance, the fault may be a blown transformer downstream of/beyond S2500. A fault location alert may then be sent to the user devices 80, 82, 84 indicative of this location or some other identifying serving to locate the fault.

Figure 15:
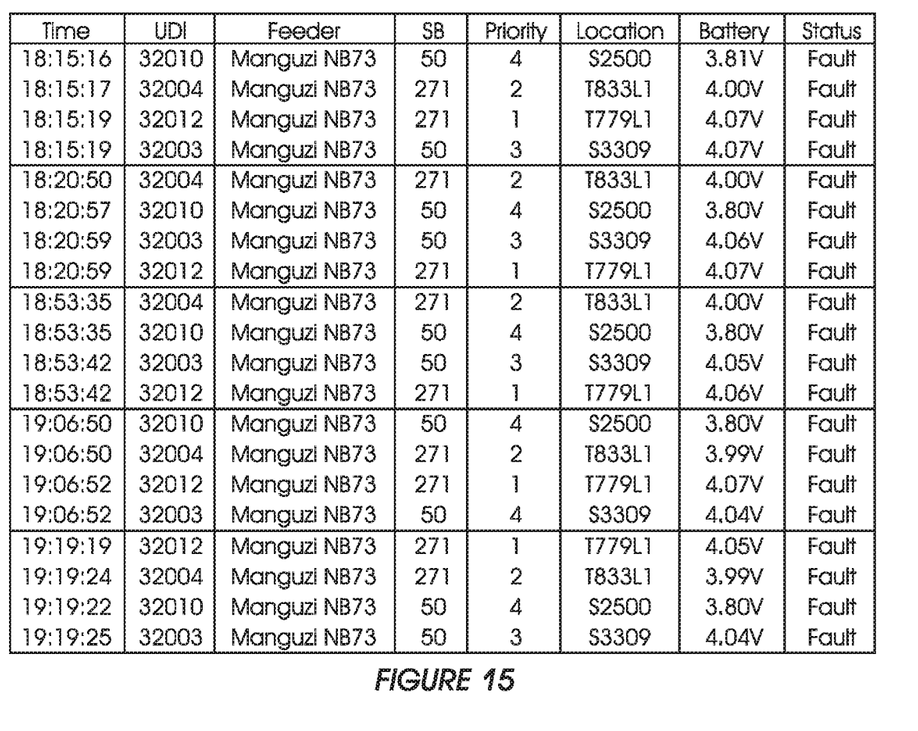
FIG. 15 is a table including test data obtained from fault current detection devices of FIG. 14 and the application of the alert ranking algorithm thereto.

FIG. 15 shows exemplary data sets which may be analysed by the master station 50. In the example of FIG. 15, five sets of faults were detected by the four detection devices (FPIs) in question, with the relevant detection devices 10 sending fault alerts (including some of the data shown in FIG. 15) to the master station 50. The ranking of the devices is shown under the "Priority" column in FIG. 15.

The Applicant believes that embodiments of the invention may provide numerous technical advantages. The detection device described herein is a relatively low-cost device, making it feasible to install these devices more widely across networks, even in areas where only "2G" cellular coverage is available.

Furthermore, the fault detection algorithm may prevent or reduce false triggers while the alert ranking algorithm may assist staff/technicians in quickly locating a fault and attending thereto. It has been found that these fault location alerts may be transmitted to the relevant user devices within as little as 2 minutes of a fault occurring.

Preferably, duration and return to normal tests are done on the detection device 10 before an alert is raised and the use of a tri-axial magnetometer may allow the detection device 10 to ignore triggers that do not come from the overhead line. Furthermore, the use of a tri-axial magnetometer may allow a solar panel to be employed on the detection device 10 without degrading its ability to sense fault current, and to permit flexible orientation of the device 10.

The use of solar panels may be useful in reducing the running cost of devices of this nature. Long-life batteries are usually expensive and last no more than 18 months, while rechargeable batteries are much cheaper and can last for years. The risk of theft is fairly low as the detection devices 10 are configured to be installed 2.5 m below the conductor and secured to the pole fairly high above the ground.

The invention claimed is:

1. A fault current detection device comprising:
   a housing configured to be mounted to a support structure of an overhead power line;
   a magnetic field sensor located in or on the housing and configured to be positioned in proximity to, but not in direct contact with, an electrical conductor of the overhead power line, the magnetic field sensor being configured to obtain magnetic field measurements;
   a processing component located in or on the housing and configured to analyze the measurements obtained by the magnetic field sensor and to apply a fault detection algorithm upon detecting a change in a magnetic field value which exceeds a predefined threshold, the fault detection algorithm including a duration test which is passed if the change occurred for more than a predefined period of time and a return to normal test which is passed if the magnetic field value substantially returns to a normal or prior level following the change, the processing component being configured to classify the change as a fault current only if the change passes both the duration test and the return to normal test;
   a communication module located in or on the housing and configured to transmit a fault alert to a remote master station in response to the processing component classifying the change as a fault current, wherein the master station is configured to be communicatively coupled to a plurality of fault current detection devices and having a processor configured to apply an alert ranking algorithm to determine which fault current detection device is closest to a fault in the event that a subset of the fault current detection devices each transmits a fault alert to the master station, wherein the alert ranking algorithm includes identifying or establishing locations of each of the subset of fault current detection devices, the subset of fault current detection devices defining a fault current path, identifying or establishing a location of an upstream source associated with the subset of fault current detection devices, wherein the upstream source is a closest upstream generating station or substation associated with the subset of fault current detection devices, the alert ranking algorithm further including ranking the subset of fault current detection devices according to their respective distances from the upstream source along the fault current path, and classifying the fault current detection device in the subset which is furthest downstream from the upstream source along the fault current path, being the fault current detection device with the highest or lowest ranking, as closest to the fault; and
   a power source for powering the magnetic field sensor, the processing component and the communication module.

2. The fault current detection device according to claim 1, wherein the magnetic field measurements are measurements of magnetic flux density or magnetic field strength.

3. The fault current detection device according to claim 1, wherein the magnetic field sensor is magnetometer or digital compass sensor.

4. The fault current detection device according to claim 3, wherein the magnetic field sensor is a tri-axial magnetometer.

5. The fault current detection device according to claim 1, wherein the housing includes a mounting formation permitting the fault current detection device to be mounted to the support structure.

6. The fault current detection device according to claim 5, wherein the support structure is a pole and the fault current detection device is configured to be mounted to the pole such that it is located within about 5 m of the conductor.

7. The fault current detection device according to claim 6, which is configured to be mounted about 2.5 m below the conductor.

8. The fault current detection device according to claim 1, wherein the communication module is a GSM (Global System for Mobile Communication) module.

9. The fault current detection device according to claim 1, wherein the communication module is configured to receive remote settings instructions from the remote master station.

10. The fault current detection device according to claim 1, wherein the power source is rechargeable.

11. The fault current detection device according to claim 10, wherein the power source is a solar power arrangement including a solar panel mounted to an exterior of the housing and one or more rechargeable batteries connected to the solar panel for providing power to the magnetic field sensor, the processing component and the communication module.

12. The fault current detection device according to claim 1, wherein the change is only classified as a fault if it exceeds an initial threshold, and wherein the threshold is a user selectable threshold.

13. The fault current detection device according to claim 12, which is configured to sample data from the magnetic field sensor once the threshold is exceeded, which data is then subjected to the duration test and the return to normal test.

14. A fault detection system comprising:
    a plurality of fault current detection devices installed across a network of overhead power lines, each fault current detection device being a fault current detection device according to claim 1; and
    a master station communicatively coupled to the fault current detection devices and including
    a receiving module for receiving fault alerts from the fault current detection devices indicative of fault currents in the network;
    a processor configured to apply an alert ranking algorithm to determine which fault current detection device is closest to a fault in the event that a subset of the fault current detection devices each transmits a fault alert to the master station, wherein the alert ranking algorithm includes identifying or establishing locations of each of the subset of fault current detection devices, the subset of fault current detection devices defining a fault current path, identifying or establishing a location of an upstream source associated with the subset of fault current detection devices, wherein the upstream source is a closest upstream generating station or substation associated with the subset of fault current detection devices, the alert ranking algorithm further including ranking the subset of fault current detection devices according to their respective distances from the upstream source along the fault current path, and classifying the fault current detection device in the subset which is furthest downstream from the upstream source along the fault current path, being the fault current detection device with the highest or lowest ranking, as closest to the fault; and a transmitting module for transmitting a fault location alert indicative of the location of the closest fault current detection device and/or of the fault.

15. The system according to claim 14, wherein the network is a medium-voltage (MV) network.

16. The system according to claim 14, wherein the transmitting module is configured to transmit the fault location alert to one or more user devices.

17. A fault detection method comprising:
receiving a fault alert from each of a plurality of fault current detection devices installed across a network of overhead power lines, each fault current detection device being a fault current detection device according to claim 1;
applying, by a processor, an alert ranking algorithm to determine which fault current detection device is closest to a fault, the alert ranking algorithm including
identifying or establishing locations of each of the fault current detection devices, the fault current detection devices defining a fault current path,
identifying or establishing a location of an upstream source associated with the fault current detection devices, wherein the upstream source is a closest upstream generating station or substation associated with the subset of fault current detection devices,
ranking the subset of fault current detection devices according to their respective distances from the upstream source along the fault current path, and
classifying the fault current detection device which is furthest downstream from the upstream source along the fault current path, being the fault current detection device with the highest or lowest ranking, as closest to the fault; and
transmitting a fault location alert indicative of the location of the closest fault current detection device and/or of the fault.

18. A fault current detection method comprising:
using a sensor positioned in proximity to, but not in direct contact with, an electrical conductor of an overhead power line to obtain magnetic field measurements;
analyzing, by a processing component, the measurements obtained by the sensor;
upon detecting a change in a magnetic field value which exceeds a predefined threshold, using the processing component to apply a fault detection algorithm including a duration test which is passed if the change occurred for more than a predefined period of time and a return to normal test which is passed if the magnetic field value substantially returns to a normal or prior level following the change;
classifying the change as a fault current if the change passes both the duration test and the return to normal test; and transmitting a fault alert to a remote master station in response to the classification of the change as a fault current, wherein the master station is communicatively coupled to a plurality of fault current detection devices and having a processor configured to apply an alert ranking algorithm to determine which fault current detection device is closest to a fault in the event that a subset of the fault current detection devices each transmits a fault alert to the master station, wherein the alert ranking algorithm includes identifying or establishing locations of each of the subset of fault current detection devices, the subset of fault current detection devices defining a fault current path, identifying or establishing a location of an upstream source associated with the subset of fault current detection devices, wherein the upstream source is a closest upstream generating station or substation associated with the subset of fault current detection devices, the alert ranking algorithm further including ranking the subset of fault current detection devices according to their respective distances from the upstream source along the fault current path, and classifying the fault current detection device in the subset which is furthest downstream from the upstream source along the fault current path, being the fault current detection device with the highest or lowest ranking, as closest to the fault.

19. The method according to claim 18, wherein the sensor and the processing component are a fault current detection device comprising:
a housing configured to be mounted to a support structure of an overhead power line;
a magnetic field sensor located in or on the housing and configured to be positioned in proximity to, but not in direct contact with, an electrical conductor of the overhead power line, the magnetic field sensor being configured to obtain magnetic field measurements;
a processing component located in or on the housing and configured to analyze the measurements obtained by the magnetic field sensor and to apply a fault detection algorithm upon detecting a change in a magnetic field value which exceeds a predefined threshold, the fault detection algorithm including a duration test which is passed if the change occurred for more than a predefined period of time and a return to normal test which is passed if the magnetic field value substantially returns to a normal or prior level following the change, the processing component being configured to classify the change as a fault current only if the change passes both the duration test and the return to normal test;
a communication module located in or on the housing and configured to transmit a fault alert to a remote master station in response to the processing component classifying the change as a fault current, wherein the master station is configured to be communicatively coupled to a plurality of fault current detection devices and having a processor configured to apply an alert ranking algorithm to determine which fault current detection device is closest to a fault in the event that a subset of the fault current detection devices each transmits a fault alert to the master station, wherein the alert ranking algorithm includes identifying or establishing locations of each of the subset of fault current detection devices, the subset of fault current detection devices defining a fault current path, identifying or establishing a location of an upstream source associated with the subset of fault current detection devices, wherein the upstream source is a closest upstream generating station or substation associated with the subset of fault current detection devices, the alert ranking algorithm further including ranking the subset of fault current detection devices according to their respective distances from the upstream source along the fault current path, and classifying the fault current detection device in the subset which is furthest downstream from the upstream source along the fault current path, being the fault current detection device with the highest or lowest ranking, as closest to the fault; and a power source for powering the magnetic field sensor, the processing component and the communication module.

* * * * *